United States Patent
Lu et al.

(10) Patent No.: US 12,224,323 B2
(45) Date of Patent: Feb. 11, 2025

(54) FABRICATION METHOD OF BURIED WORDLINE STRUCTURE

(71) Applicant: CHANGXIN MEMORY TECHNOLOGIES, INC., Hefei (CN)

(72) Inventors: Yong Lu, Hefei (CN); Hongkun Shen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 697 days.

(21) Appl. No.: 17/445,595

(22) Filed: Aug. 21, 2021

(65) Prior Publication Data

US 2022/0037478 A1 Feb. 3, 2022

Related U.S. Application Data

(63) Continuation of application No. PCT/CN2021/096669, filed on May 28, 2021.

(30) Foreign Application Priority Data

May 15, 2020 (CN) .......................... 202010410658.5

(51) Int. Cl.
*H01L 29/40* (2006.01)
*G11C 5/06* (2006.01)
*H01L 21/762* (2006.01)
*H01L 29/423* (2006.01)
*H10B 12/00* (2023.01)

(52) U.S. Cl.
CPC ............ *H01L 29/401* (2013.01); *G11C 5/063* (2013.01); *H01L 21/76232* (2013.01); *H01L 29/4236* (2013.01); *H01L 29/42364* (2013.01); *H10B 12/488* (2023.02)

(58) Field of Classification Search
CPC .............. G11C 5/063; H01L 21/76232; H01L 29/4236; H10B 12/488
See application file for complete search history.

(56) References Cited

U.S. PATENT DOCUMENTS

| 8,294,188 B2 | 10/2012 | Popp et al. |
| 2011/0049595 A1 | 3/2011 | Xiao |
| 2012/0080746 A1 | 4/2012 | Kim |

FOREIGN PATENT DOCUMENTS

| CN | 1667817 A | * | 9/2005 | ....... H01L 27/10894 |
| CN | 107946232 A | | 4/2018 | |
| CN | 109216433 A | | 1/2019 | |
| CN | 110610940 A | | 12/2019 | |
| CN | 110896075 A | | 3/2020 | |

(Continued)

OTHER PUBLICATIONS

International Search Report in Application No. PCT/CN2021/096669, mailed on Aug. 4, 2021.

*Primary Examiner* — Walter H Swanson
*Assistant Examiner* — Moataz Khalifa
(74) *Attorney, Agent, or Firm* — Syncoda LLC; Feng Ma

(57) ABSTRACT

A buried wordline structure fabrication method includes: providing a first trench in a semiconductor substrate, wherein the first trench has a tip on its bottom; performing epitaxial growth within the first trench to reduce the depth of the tip on the bottom of the first trench; and forming a gate dielectric layer on an inner wall of the first trench and filling a gate conductive layer within the first trench to form the buried wordline structure.

15 Claims, 4 Drawing Sheets

(56) References Cited

FOREIGN PATENT DOCUMENTS

| | | | | | |
|---|---|---|---|---|---|
| CN | 110931486 | A | | 3/2020 | |
| CN | 111128895 | A | * | 5/2020 | ............. H10B 12/30 |
| DE | 102019117150 | A1 | * | 1/2020 | ....... H01L 21/28008 |
| TW | 389999 | B | * | 5/2000 | |

* cited by examiner

FABRICATION METHOD OF BURIED WORDLINE STRUCTURE

CROSS-REFERENCE TO RELATED APPLICATIONS

This application is a continuation of International Patent Application No. PCT/CN2021/096669 filed on May 28, 2021, which claims priority to Chinese Patent Application No. 202010410658.5 filed on May 15, 2020. The disclosures of these applications are hereby incorporated by reference in their entirety.

BACKGROUND

In a fabrication procedure for the semiconductor technology, a conventional procedure for forming a buried wordline structure includes: etching a semiconductor substrate to form a first trench in a semiconductor substrate; and filling a wordline structure within the first trench to form a buried wordline structure.

SUMMARY

The present disclosure relates generally to the field of semiconductors, and more specifically to a buried wordline structure and a fabrication method thereof.

In one aspect, the present disclosure provides a fabrication method for a buried wordline structure, including:
  providing a first trench in a semiconductor substrate, wherein the first trench has a tip on its bottom;
  performing epitaxial growth within the first trench to reduce the depth of the tip on the bottom of the first trench; and
  forming a gate dielectric layer on an inner wall of the first trench and filling a gate conductive layer within the first trench to form a buried wordline structure.

In another aspect, the present disclosure provides a buried wordline structure, including:
  a semiconductor substrate;
  a trench isolation structure, formed in the semiconductor substrate, wherein a surface layer of the semiconductor substrate is divided into a plurality of independent regions by the trench isolation structure;
  a first trench, provided in the semiconductor substrate, wherein the first trench has a planar bottom;
  a second trench, provided in the trench isolation structure, wherein the second trench has a tip on its bottom, the first trench and the second trench are connected with each other to form a connection trench, and the depth of the second trench is greater than that of the first trench;
  a gate dielectric layer, formed on the inner wall of the first trench; and
  a gate conductive layer, filled within the first trench and the second trench.

Details of one or more embodiments of the present disclosure are set forth in the following accompanying drawings and descriptions. Other features, objectives and advantages of the present disclosure become obvious with reference to the specification, the accompanying drawings, and the claims.

BRIEF DESCRIPTION OF THE DRAWINGS

In order to better describe and illustrate embodiments of the present application, reference may be made to one or more accompanying drawings. Additional details or examples used to describe the accompanying drawings should not be considered as limitations on the scope of any of the invention-creations, the embodiments described hereinafter, and the preferred embodiments of the present application.

DETAILED DESCRIPTION

Figure 1:
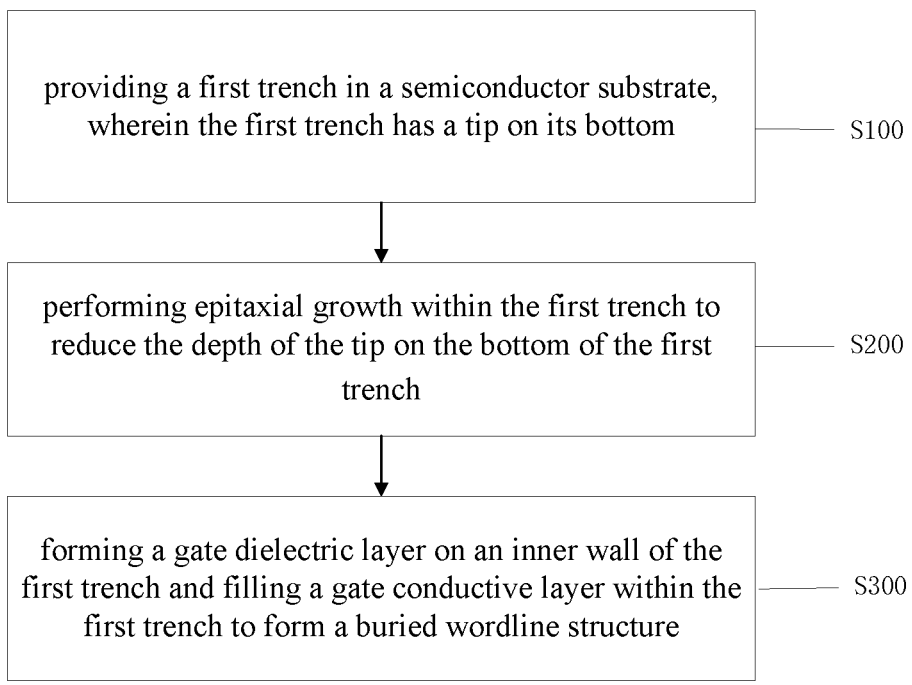
FIG. 1 is a flowchart of steps of a fabrication method for a buried wordline according to an embodiment.

For easy understanding of the present disclosure, a more comprehensive description of the present disclosure will be given below with reference to the relevant accompanying drawings. Embodiments of the present disclosure are given in the drawings. However, the present disclosure may be implemented in many different forms and is not limited to the embodiments described herein. Rather, these embodiments are provided to make the contents disclosed in the present disclosure more thorough and comprehensive.

Unless defined otherwise, all technical and scientific terms used herein have the same meanings as are commonly understood by those skilled in the art. The terms used herein in the specification of the present disclosure are for the purpose of describing specific embodiments only but not intended to limit the present disclosure.

Because an etching environment inside a first trench is difficult to control in a process of etching the semiconductor substrate, the semiconductor substrate at different positions may be unevenly etched, the first trench formed by etching has a non-planar bottom, and tips or burrs easily occur in the bottom of the first trench. For a semiconductor device, point discharge easily occurs if the bottom of a wordline has the tips, resulting in damage to the semiconductor device.

FIG. 1 is a flowchart of steps of a fabrication method for a buried wordline structure according an embodiment of the present disclosure. The fabrication method for the buried wordline structure includes the following steps.

In step S100, a first trench is provided in a semiconductor substrate, wherein the first trench has a tip on its bottom.

Figure 2:
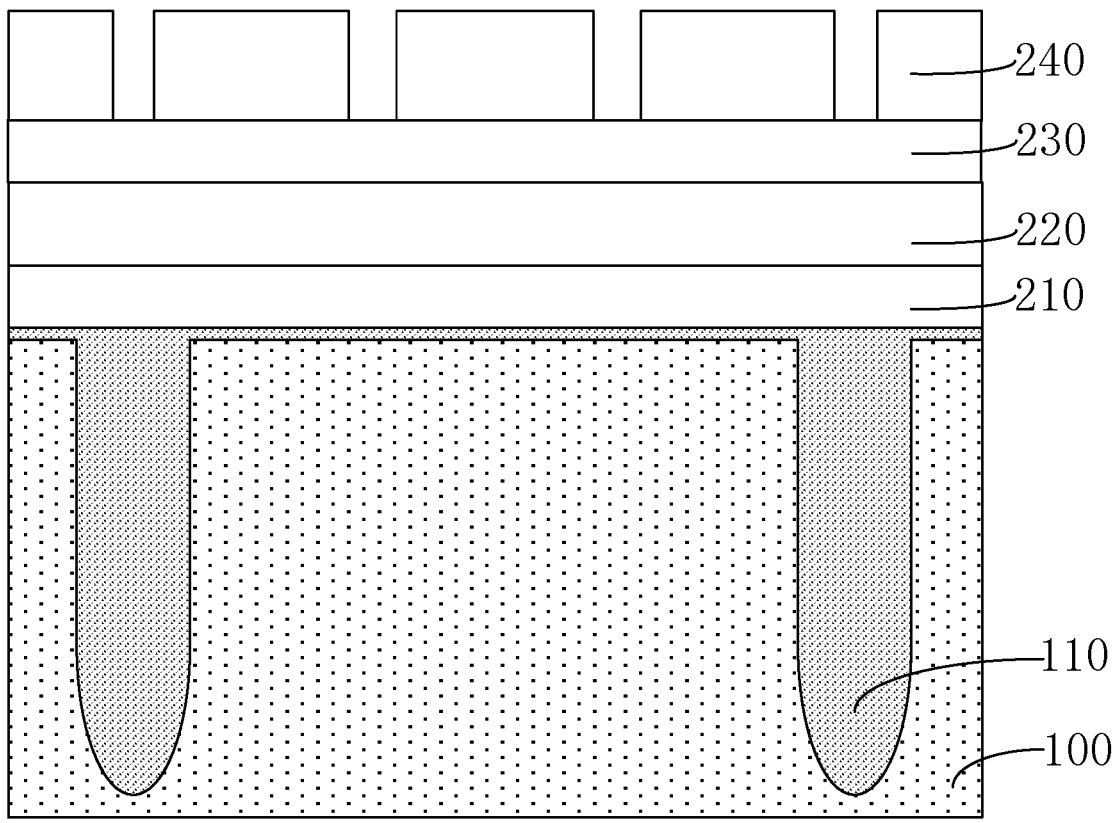
FIG. 2 is a schematic diagram after a mask layer is formed on a semiconductor substrate according to an embodiment.

As shown in FIG. 2, a semiconductor substrate 100 is provided. The semiconductor substrate 100 may be made of monocrystalline silicon doped with impurities, silicon-on-insulator (SOI), stacked silicon-on-insulator (SSOI), stacked SiGe-on-insulator (S—SiGeOI), SiGe-on-insulator (SiGeOI), germanium-on-insulator (GeOI), and the like. As an example, in this embodiment, the semiconductor substrate 100 is made of monocrystalline silicon.

Figure 3A:
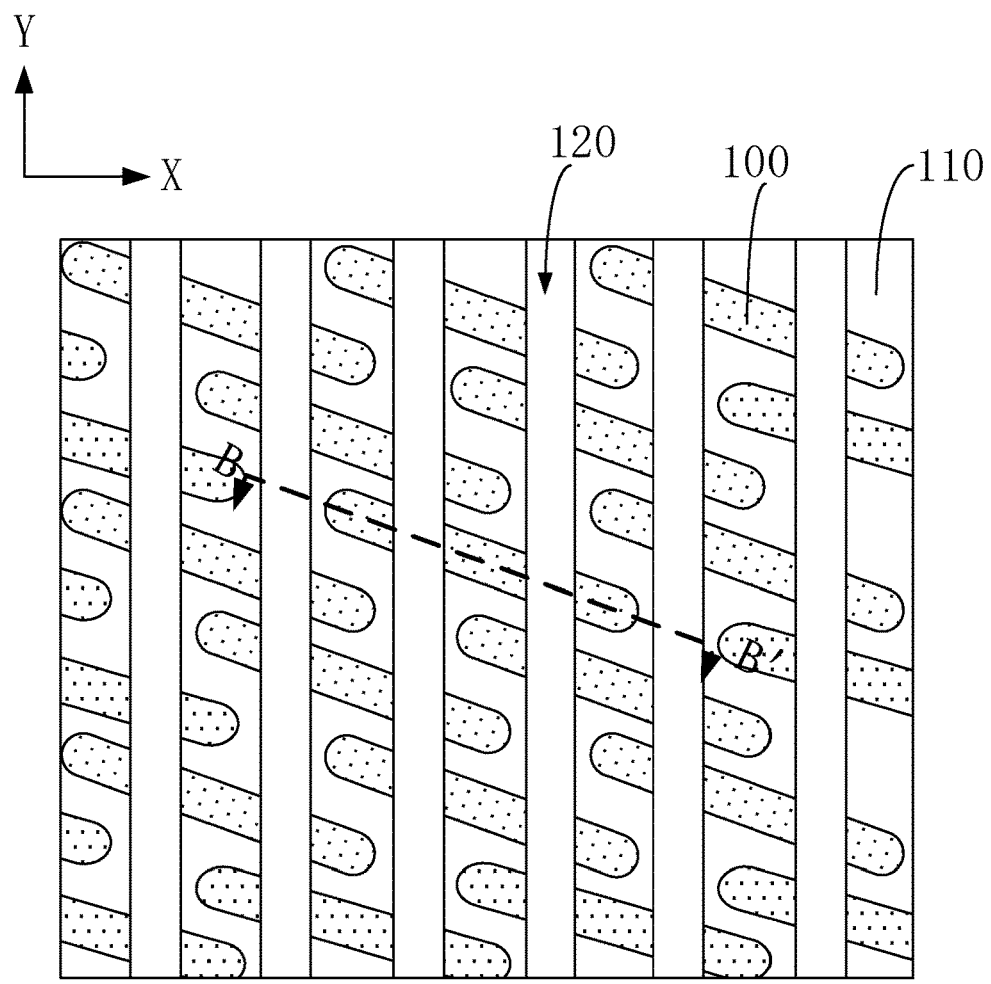
FIG. 3A is a top view of a positional relationship among a semiconductor substrate, a trench isolation structure and a connection trench according to an embodiment.
Figure 3B:
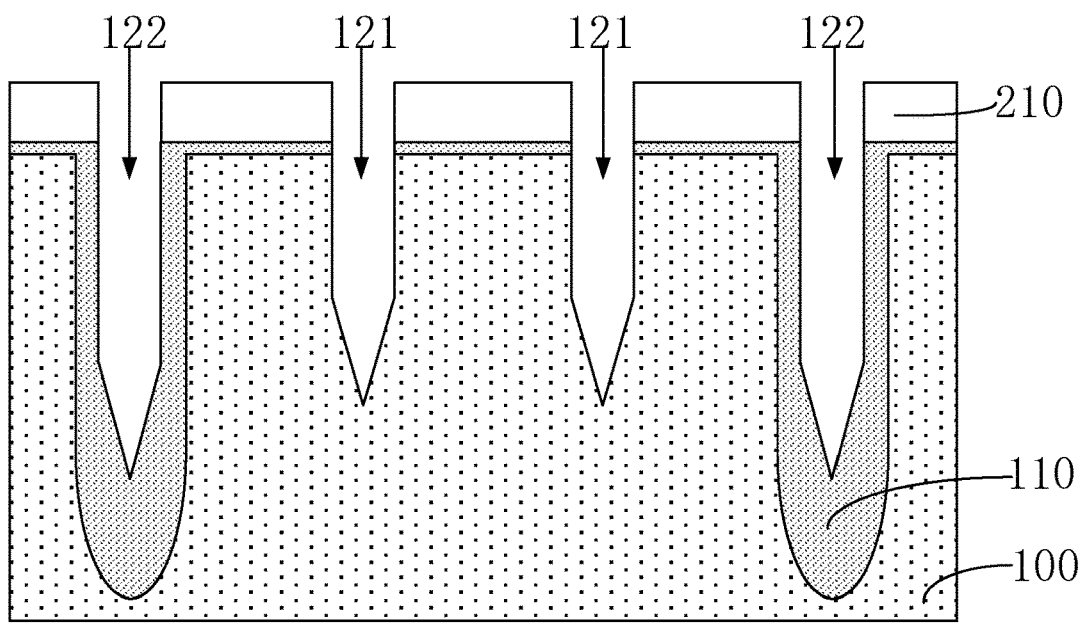
FIG. 3B is a side cross-sectional view taken along a section line BB' in FIG. 3A according to an embodiment.

A mask layer is formed on the semiconductor substrate 100, and an etching window is defined on an upper surface of the semiconductor substrate 100 by the mask layer. The mask layer may be of a monolayer structure or a multilayer structure, which may be differently selected according to process requirements. In this embodiment, the mask layer has three layers stacked. The mask layer includes a first mask layer 210, a second mask layer 220 and a third mask layer 230 which are sequentially stacked on the semiconductor substrate 100, wherein the first mask layer 210 is made of silicon nitride, the second mask layer 220 is made of spin-coated carbon, and the third mask layer 230 is made of silicon oxynitride. It should be understood that the surface of the semiconductor substrate 100 is easily oxidized. Therefore, a thin silicon oxide layer is formed on the surface of the semiconductor substrate 100. Further, a photoresist layer 240 is formed on the third mask layer 230. An etching window for the third mask layer 230 is defined in the third mask layer 230 by means of the photoresist layer 240. The third mask layer 230, the second mask layer 220 and the first mask layer 210 are sequentially etched. The etching window is moved downwards to the first mask layer 210 and the semiconductor substrate 100 to be etched is exposed. Then, the semiconductor substrate 100 is etched, and as shown in FIG. 3B, a first trench 121 is formed in the semiconductor substrate 100. At this time, since the first trench 121 is internally etched unevenly, etching ions on the bottom of the first trench 121 are relatively small, resulting in a tip on the bottom of the first trench 121. In an embodiment, after the first trench 121 is etched in the semiconductor substrate 100, the second mask layer 220, the third mask layer 230 and the photoresist layer 240 may be removed.

In an embodiment, as shown in FIG. 2, a trench isolation structure 110 extending into the semiconductor substrate 100 is formed in the semiconductor substrate 100, and the trench isolation structure 110 may be specifically formed by providing a deep isolation trench within the semiconductor substrate 100 and filling an isolation material within the deep isolation trench. Specifically, the trench isolation structure 110 includes one or more of isolation materials, such as silicon nitride, silicon oxide and silicon oxynitride. In this embodiment, the trench isolation structure 110 includes silicon oxide. The semiconductor substrate 100 is divided into a plurality of independent regions by the trench isolation structure 110 to form active regions. In an embodiment, as shown in FIG. 3A and FIG. 3B, the semiconductor substrate 100 and the trench isolation structure 110 may be etched respectively to form a first trench 121 in the semiconductor substrate 100 and a second trench 122 in the trench isolation structure 110, wherein the second trench 122 and the first trench 121 are connected with each other to form a connection trench 120. Further, the depth of the first trench 121 is less than that of the second trench 122. As shown in FIG. 3A, a plurality of connection trenches 120 are juxtaposed along an X-axis direction, each connection trench 120 extends laterally along a Y-axis direction, the same connection trench 120 laterally penetrates the semiconductor substrate 100 and the trench isolation structure 110 along the Y-axis direction, and the X-axis direction is different from the Y-axis direction, that is, an included angle between the X-axis direction and the Y-axis direction is greater than 0° and less than 180°. Optionally, an X-axis is perpendicular to a Y-axis. The trench provided in the semiconductor substrate 100 serves as the first trench 121, and the trench provided in the trench isolation structure 110 serves as the second trench 122. Subsequently, when the wordline structure is filled within the trenches, the first trench 121 in the semiconductor substrate 100 and the second trench 122 in the trench isolation structure 110 may be filled simultaneously, that is, the wordline structure is formed within the connection trench 120, so that ON or OFF of the plurality of active regions may be controlled simultaneously by means of the same wordline structure. It should be noted that the first trench 121 and the second trench 122 shown in FIG. 3B are located on different connection trenches 120. Therefore, the first trench 121 and the second trench 122 shown in FIG. 3B are not connected.

In step S200, epitaxial growth is performed within the first trench to reduce the depth of the tip on the bottom of the first trench.

Figure 4:
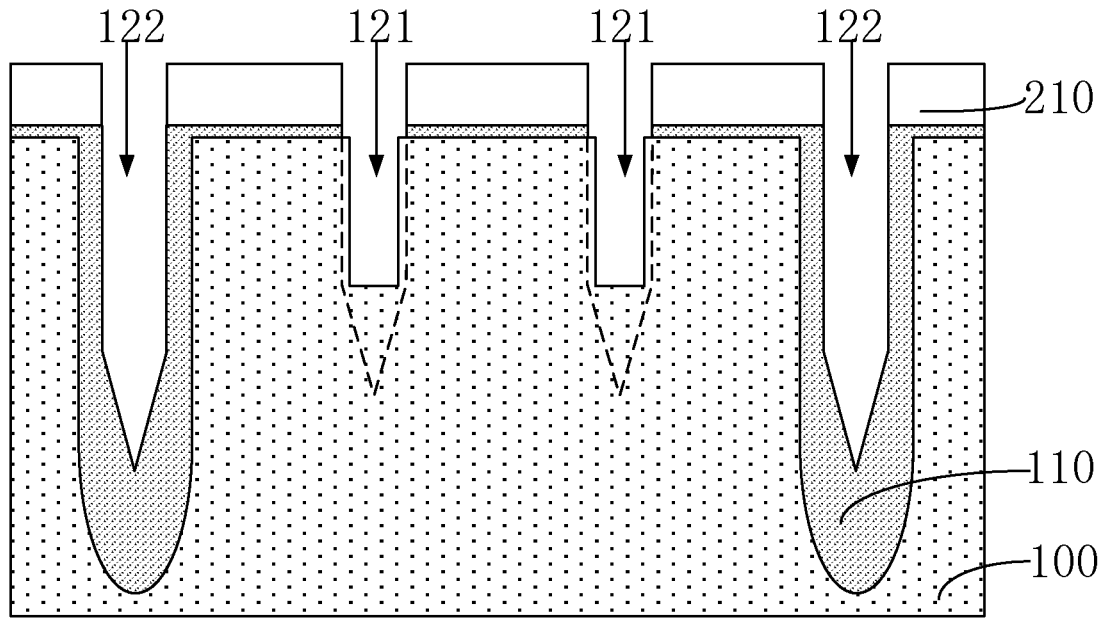
FIG. 4 is a schematic structural diagram after epitaxial growth is performed according to an embodiment.

As shown in FIG. 4, the epitaxial growth is performed to grow an epitaxial layer on an inner wall of the first trench 121. An epitaxial growth rate of a tip on a bottom of the first trench 121 is greater than that of a tip on a sidewall of the first trench 121. The epitaxial layer quickly fills the tip on the bottom of the first trench 121 to make the bottom of the first trench 121 gradually planar. Further, the depth of the tip on the bottom of the first trench 121 may be reduced by the epitaxial growth, until the tip on the bottom of the first trench 121 disappears, that is, the tip on the bottom of the first trench 121 is filled with the epitaxial layer, and the epitaxially grown first trench 121 has a planar bottom. In an embodiment, the width of an opening of the first trench 121 ranges from 30 nm to 50 nm, and the depth of the first trench 121 ranges from 60 nm to 80 nm. The smaller the width of the opening of the trench is, the smaller an angle of the tip on the bottom is, and the faster the speed of filling the tip by the epitaxial growth is. However, filling the wordline structure will be affected by excessively small width of the opening of the trench. In this embodiment, the first trench 121 with a size within the above-mentioned size may quickly eliminate the tip by means of the epitaxial growth, and may be smoothly filled in the wordline structure.

In an embodiment, the mask layer formed in the step S100 is incompletely removed. As shown in FIG. 4, the first mask layer 210 of the mask layer covers the semiconductor substrate 100 outside the trench. When the epitaxial growth is performed within the trench 121, the mask layer serves as a protective layer, which may avoid performing the epitaxial growth on the surface of the semiconductor substrate 100 outside the first trench 121, that is, the structure formed in the step S100 is placed within an epitaxial chamber, an epitaxial layer is grown only within the first trench 121, and other regions are not affected. In other embodiments, an epitaxial layer may be grown on the surface of the semiconductor substrate 100 outside the trench, and after the epitaxial growth is completed, the epitaxial layer outside the trench is polished away by a polishing process.

In an embodiment, the second trench 122 is provided in the isolation structure 110. Since the epitaxial growth only occurs on the semiconductor substrate 100, no epitaxial growth is performed within the second trench 122, that is, no influence on the depth of the second trench 122 is generated by the epitaxial growth. After the epitaxial growth is performed, the first trench 121 becomes shallower, a depth difference between the first trench 121 and the second trench 122 becomes larger, and the width of a conductive channel is increased, so that a saturation current of the device may be increased.

In an embodiment, before the epitaxial growth is performed, it is necessary to perform in-situ cleaning on the inner wall of the first trench 121. Before the epitaxial growth is performed, the above structure is exposed to air. There may be an oxide layer and impurities (such as particles, organic matters, inorganic metal ions) on the inner wall of the first trench 121. The epitaxial growth will be affected by oxides and the impurities. Therefore, there is a need for performing in-situ cleaning on the inner wall of the first trench 121. Specifically, microparticles may be utilized by utilizing a liquid 1, wherein the liquid 1 is prepared from $NH_4OH$ with a concentration of 28%, $H_2O_2$ with a concentration of 30% and deionized water, with a volume ratio of $NH_4OH:H_2O_2:H_2O=1:1:5$. Metal ions may be removed by utilizing a liquid 2, wherein the liquid 2 is prepared from HCl, $H_2O_2$ and deionized water, with a volume ratio of $HCl:H_2O_2:H_2O=1:1:6$. Organic matters may be removed by utilizing a liquid 3, wherein the liquid 3 is prepared from $H_2SO_4$ and $H_2O_2$, with a volume ratio of $H_2SO_4:H_2O_2=4:1$. The oxide layer is removed by utilizing diluted HF(DHF).

In an embodiment, the above-mentioned epitaxial growth has the advantages of high growth speed and ease of control which are possessed by selective chemical vapor epitaxial growth and chemical vapor epitaxial growth. In an embodiment, reactant gases used in the chemical vapor phase epitaxial growth include $SiCl_4$ and $H_2$, and the reaction equation is described as follows: $SiCl_4+H_2=Si+4HCl$. A specific process of the chemical vapor phase epitaxial growth involves: the semiconductor substrate 100 is placed in the epitaxial chamber; air is introduced to keep the semiconductor substrate 100 in an inert gas environment; then $SiCl_4$ and $H_2$ are introduced; the epitaxial chamber is heated to 1100° C. to 1300° C., such as 1200 C; the epitaxial growth is performed for a preset duration, wherein the duration of the epitaxial growth may be determined according to the thickness of the epitaxial layer to be grown; after the preset time, $H_2$ is introduced for washing and cooling; then, $N_2$ is introduced for washing; and when the semiconductor substrate 100 is cooled below 300° C., the semiconductor substrate 100 is taken out. Therefore, the epitaxial growth is completed.

In step S300, a gate dielectric layer is formed on the inner wall of the first trench and a gate conductive layer is filled within the first trench 121, so that the buried wordline structure is formed.

Figure 5:
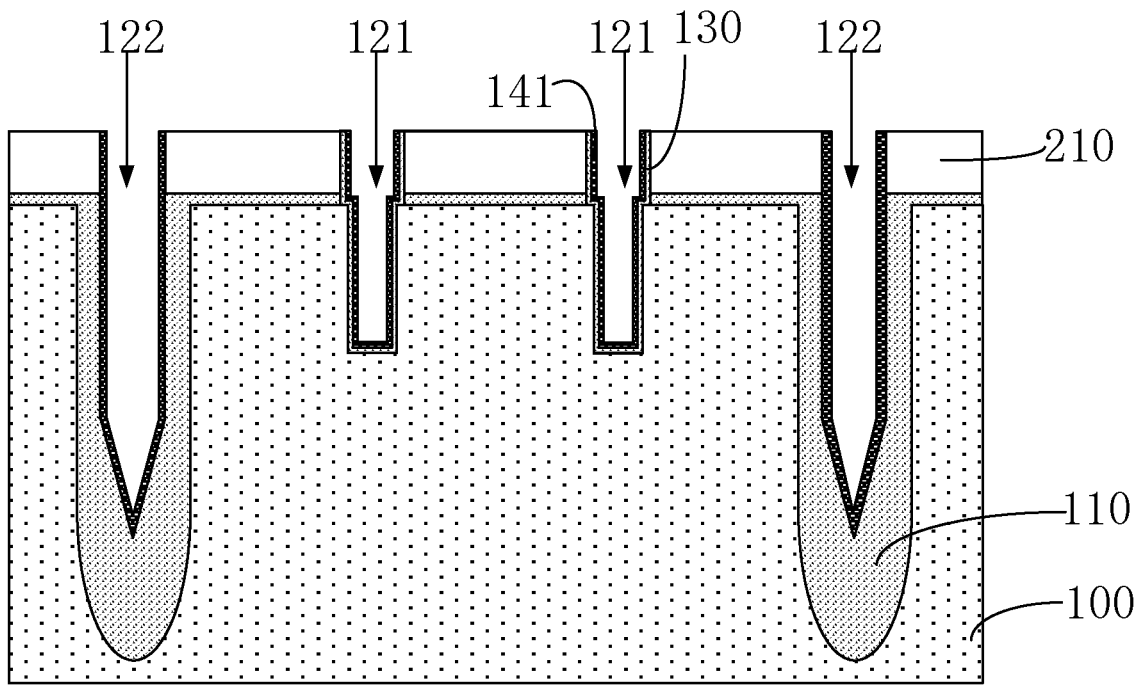
FIG. 5 is a schematic structural diagram after a gate dielectric layer and a conductive liner layer are sequentially formed on an inner wall of the first trench and a wall of the second trench according to an embodiment.

As shown in FIG. 5, a gate dielectric layer 130 is formed on the inner wall of the first trench 121. Specifically, the gate dielectric layer 130 may be an oxide layer, or may be made of other high-dielectric-constant dielectric materials. In an embodiment, the oxide layer may be formed on the inner wall of the first trench 121 as the gate dielectric layer 130 by a thermal oxidation process. In another embodiment, an oxide layer may be grown in a high-temperature water vapor atmosphere as the gate dielectric layer 130 by an in-situ steam generation (ISSG) method. The method is high in speed of growing the oxide layer. Moreover, the oxide layer generated by the in-situ water vapor generation method has better electrical properties. In other embodiments, the gate dielectric layer 130 may be formed by a deposition process, for example, the gate dielectric layer 130 may be formed by an atomic layer deposition process.

Figure 6:
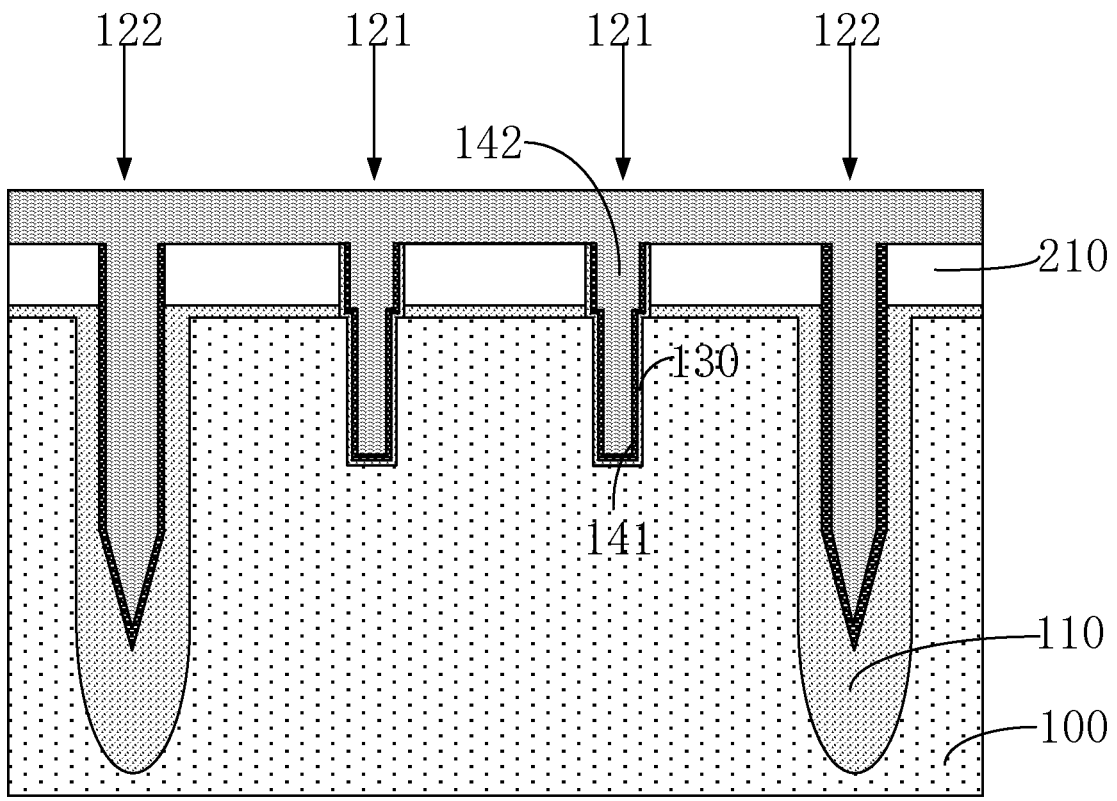
FIG. 6 is a schematic diagram after a main conductive layer is deposited according to an embodiment.

After the gate dielectric layer 130 is formed, a gate conductive layer 140 is continuously filled within the trench (see FIG. 7), so that the gate dielectric layer 130 and the gate conductive layer 140 may form a wordline structure. In an embodiment, as shown in FIG. 5 and FIG. 6, the gate conductive layer 140 includes a conductive liner layer 141 and a main conductive layer 142. In an embodiment, after the gate dielectric layer 130 is formed, the conductive liner layer 141 is formed on the gate dielectric layer 130 by a deposition process. Specifically, an atomic layer deposition process, a chemical vapor deposition process, etc. may be selected. Specifically, the conductive liner layer 141 may be a titanium nitride film. After the conductive liner layer 141 is formed, the main conductive layer 142 is continuously filled within the first trench 121 through a deposition process, and the main conductive layer 142 may specifically be a metal layer, for example, tungsten. In an embodiment, the main conductive layer 142 deposited by the deposition process not only fills the first trench 121, but also extends beyond the first trench 121 and covers the structure outside the first trench 121. At this time, the main conductive layer 142 outside the first trench 121 may be removed by the polishing process.

Figure 7:
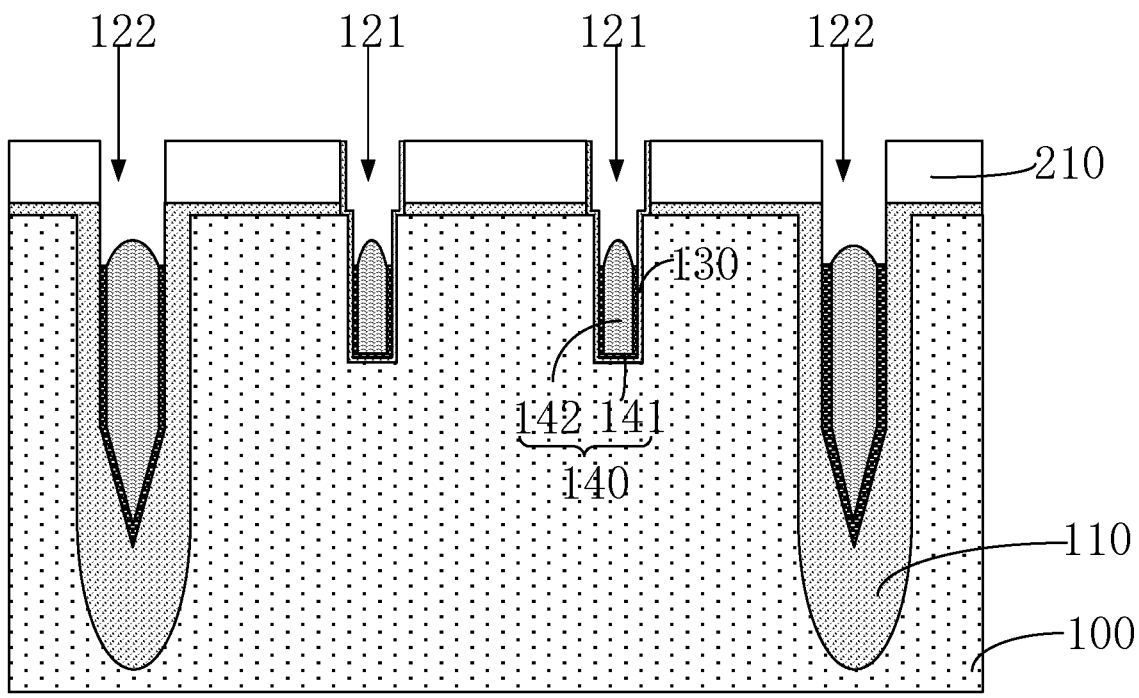
FIG. 7 is a schematic diagram showing a buried wordline structure formed according to an embodiment.

In an embodiment, the conductive liner layer 141 covers the entire inner wall of the first trench 121 and the main conductive layer 142 fills the first trench 121. Upper surfaces of the main conductive layer 142 and the conductive liner layer 141 are flush. At this time, the conductive liner layer 141 and the main conductive layer 142 are continuously etched back to reduce the height of the conductive liner layer 141 and the main conductive layer 142, as shown in FIG. 7. Specifically, an etch selectivity ratio of an etching agent selected by the etching back for the conductive liner layer 141 and the main conductive layer 142 is greater than 1, that is, the etching speed of the etching agent for the conductive liner layer 141 is greater than that of the etching agent for the main conductive layer 142. Therefore, a middle region of the gate conductive layer 140 subjected to the etching back upwards raises, and the upper surface of the gate conductive layer 140 is Ω-shaped. Further, the above-mentioned etching back may be selected from isotropic etching. The gate conductive layer 140 may be etched from the side by the isotropic etching, which relatively easily controls the upper surface of the gate conductive layer 140 to be Ω-shaped. Specifically, the above isotropic etching is dry etching, and an etching agent for the drying etching includes $NF_3$ and $Cl_2$. The dry etching is easy to control, and etching conditions may be adjusted in real time, so that the gate conductive layer 140 has a better etching morphology. In the above embodiment, the upper surface of the gate conductive layer 140 is Ω-shaped. After the source region and the drain region are formed on two sides of the wordline structure, the overlap area of the wordline structure and the drain region may be reduced. Accordingly, the electric leakage is reduced and the device performance is improved.

In an embodiment, a first trench 121 is provided in the semiconductor substrate 100, and a second trench 122 is provided in the trench isolation structure 110. The conductive liner layer 141 and the main conductive layer 142 are deposited by a deposition process. The conductive liner layer 141 and the main conductive layer 142 are formed within each of the first trench 121 and the second trench 122. When the conductive liner layer 141 and the main conductive layer 142 are etched through an etching back process, the conductive liner layer 141 and the main conductive layer 142 in each of the first trench 121 and the second trench 122 will be etched.

In an embodiment, after the buried wordline structure is formed, the mask layer on the surface of the semiconductor substrate 100 may be removed to expose the surface of the semiconductor substrate 100. Then, the semiconductor substrate 100 is doped to form a source region and a drain region on two sides of the buried wordline structure, so that a metal-oxide-semiconductor field-effect transistor (MOSFET) is formed. Further, the drain region is connected with a bit line, a storage capacitor is formed above the source region, and a bottom plate of the storage capacitor is electrically connected with the source region, so that a semiconductor memory, such as a dynamic random-access memory (DRAM), may be formed. Certainly, other types of memories may be formed.

As for the above-mentioned fabrication method for the buried wordline structure, after the first trench 121 is provided in the semiconductor substrate 100 and before the wordline structure is filled within the first trench 121, the epitaxial layer is grown within the first trench 121 by an epitaxial growth process. In an epitaxial growth process, the epitaxial growth rate of the tip on the bottom of the first trench 121 is greater than that of the sidewall of the first trench 121, so that a thicker epitaxial layer may be grown faster at the tip to fill the tip. After the epitaxial growth is performed, the depth of the tip on the bottom of the first trench 121 becomes smaller, and the bottom of the first trench 121 tends to be planar. In this way, the discharge from the tip is reduced and the stability of the device is improved. Meanwhile, the depth of the first trench 121 becomes smaller, which may increase a height difference between the bottom of the first trench 121 and the bottom of the second trench 122. As a result, the width of the conductive channel is increased, then the saturation current of a switching tube is enhanced and the electrical performance of the device is improved.

The present application further relates to a buried wordline structure. As shown in FIG. 7, the buried wordline structure includes a semiconductor substrate 100. Specifically, the semiconductor substrate 100 may be made of monocrystalline silicon doped with impurities, silicon on insulator (SOI), stacked silicon-on-insulator (SSOI), stacked SiGe-on-insulator (S—SiGeOI), SiGe-on-insulator (SiGeOI), and germanium-on-insulator (GeOI). As an example, in this embodiment, the semiconductor substrate 100 is made of monocrystalline silicon.

The trench isolation structure 110 is formed in the semiconductor substrate 100, and a surface layer of the semiconductor substrate 100 is divided into a plurality of independent regions by the trench isolation structure 110. As shown in FIG. 3A and FIG. 3B, a trench isolation structure 110 extending into the semiconductor substrate 100 is formed on the semiconductor substrate 100, and the trench isolation material is formed. Specifically, the trench isolation structure 110 includes one or more of isolation materials such as silicon nitride, silicon oxide and silicon oxynitride. In this embodiment, the trench isolation structure 110 includes silicon oxide. The semiconductor substrate 100 is divided into a plurality of independent regions by the trench isolation structure 110 to form active regions.

The buried wordline structure further includes a first trench 121, wherein the first trench 121 is provided in the semiconductor substrate 100, and the first trench 121 has a planar bottom.

The buried wordline structure further includes a second trench 122, wherein the second trench 122 is provided in the trench isolation structure 110, and the second trench 122 has a tip on its bottom. The first trench 121 and the second trench 122 in the same extending direction are connected with each other to form a connection trench 120, and the depth of the second trench 122 is greater than that of the first trench 121. As shown in FIG. 3A and FIG. 3B, the connection trench 120 laterally penetrates the semiconductor substrate 100 and the trench isolation structure 110 in an extension direction of the length of the connection trench 120, wherein the trench provided in the semiconductor substrate 100 serves as the first trench 121, and the trench provided in the trench isolation structure 110 serves as the second trench 122. The first trench 121 and the second trench 122 are connected with each other.

The buried wordline structure further includes a gate dielectric layer 130, wherein the gate dielectric layer 130 is formed on the inner wall of the first trench 121. Specifically, the gate dielectric layer 130 may be an oxide layer, or may be made of other high-dielectric-constant dielectric materials.

The buried wordline structure further includes a gate conductive layer 140, wherein the gate conductive layer 140 is filled within the first trench 121 and the second trench 122. In an embodiment, the gate conductive layer 140 includes a conductive liner layer 141 and a main conductive layer 142, wherein the conductive liner layer 141 is interposed between the main conductive layer 142 and the gate dielectric layer 130. Specifically, the conductive liner layer 141 may be a titanium nitride film. Specifically, the main conductive layer 142 may be a metal layer, for example, tungsten.

As for the above-mentioned buried wordline structure, a trench isolation structure 110 is formed in the semiconductor substrate 100. The semiconductor substrate 100 is divided into a plurality of independent regions by the trench isolation structure 110 to form a plurality of active regions. The first trench 121 is provided in the semiconductor substrate 100, and the second trench 122 is provided in the trench isolation structure 110, wherein the first trench 121 and the second trench 122 are connected with each other to form a connection trench 120. The gate conductive layer 140 is formed within the connection trench 120. As such, the plurality of active regions may be controlled by one connection trench 120. Moreover, the first trench 121 has a planar bottom, which may avoid the discharge from the tip. The second trench 122 has a tip on its bottom, and the tip is generated in the trench isolation structure 110, so that no discharge from the tip occurs. The tip within the second trench 122 is reserved, such that a height difference between the bottom of the first trench 121 and the bottom of the second trench 122 is larger, which may increase the width of the conductive trench and increase the saturation current of the device.

In an embodiment, the upper surface of the gate conductive layer 140 is Ω-shaped. After the source region and the drain region are formed on two sides of the wordline structure, the overlap area between the wordline structure and the drain region may be reduced. As a result, the electric leakage is reduced, and the performance of the device is improved.

In an embodiment, the active region and the drain region are formed on two sides of the buried wordline. The buried wordline structure, the source region and the drain region form a metal-oxide-semiconductor field-effect transistor (MOSFET). Further, the drain region is connected to the bit line, the storage capacitor is formed above the source region, and the bottom plate of the storage capacitor is electrically connected with the source region, so that the semiconductor memory, such as the dynamic random access memory (DRAM), may be formed. Certainly, other types of memories may be formed.

The above embodiments only describe several implementations of the present disclosure, and their description is specific and detailed, but cannot therefore be understood as a limitation on the patent scope of the present disclosure. It should be noted that those of ordinary skill in the art may further make several variations and improvements without departing from the conception of the present disclosure, and these all fall within the protection scope of the present disclosure. Therefore, the patent protection scope of the present disclosure should be subject to the appended claims.

What is claimed is:

1. A fabrication method for a buried wordline structure, comprising:
   providing a first trench in a semiconductor substrate, wherein the first trench has a tip on its bottom;
   performing epitaxial growth on the semiconductor substrate within the first trench to reduce the depth of the tip on the bottom of the first trench; and
   forming a gate dielectric layer on an inner wall of the first trench and filling a gate conductive layer within the first trench to form the buried wordline structure.

2. The fabrication method according to claim 1, wherein a trench isolation structure is formed in the semiconductor substrate, and a surface layer of the semiconductor substrate is divided into a plurality of independent regions by the trench isolation structure; and before performing epitaxial growth within the first trench, the method further comprises:
   providing a second trench in the trench isolation structure, wherein the second trench and the first trench are connected with each other, and the depth of the first trench is less than that of the second trench.

3. The fabrication method according to claim 1, wherein a second trench has a tip on its bottom.

4. The fabrication method according to claim 1, wherein a width of an opening of the first trench ranges from 30 nm to 50 nm, and a depth of the first trench ranges from 60 nm to 80 nm.

5. The fabrication method according to claim 1, wherein said providing a first trench in the semiconductor substrate comprises:
   forming a mask layer on the semiconductor substrate and defining an etching window by the mask layer; and
   etching the semiconductor substrate through the etching window to form the first trench; and
   said performing the epitaxial growth within the first trench comprises:
   using the mask layer as a protective layer to avoid performing epitaxial growth on the surface of the semiconductor substrate outside the first trench.

6. The fabrication method according to claim 1, wherein prior to that the epitaxial growth is performed within the first trench, in-situ cleaning is performed on the inner wall of the first trench.

7. The fabrication method according to claim 1, wherein said performing the epitaxial growth within the first trench to reduce the depth of the tip on the bottom of the first trench comprises: performing epitaxial growth within the first trench to reduce the depth of the tip until the tip disappears.

8. The fabrication method according to claim 1, wherein said performing the epitaxial growth within the first trench comprises: performing chemical vapor phase epitaxy within the first trench, wherein reactant gases for the epitaxial growth comprise $SiCl_4$ and $H_2$.

9. The fabrication method according to claim 1, wherein said forming the gate dielectric layer on the inner wall of the first trench and filling the gate conductive layer within the first trench comprises:
   forming a gate dielectric layer on an inner wall of the first trench;
   forming a conductive liner layer on the gate dielectric layer and filling a main conductive layer within the first trench, wherein the gate dielectric layer comprises the conductive liner layer and the main conductive layer; and
   etching back the gate dielectric layer by utilizing an etching agent, wherein an etch selectivity ratio of the etching agent for the conductive liner layer and the main conductive layer is greater than 1, so that an upper surface of the etched gate dielectric layer is Ω-shaped.

10. The fabrication method according to claim 9, wherein the etching back is anisotropic etching.

11. The fabrication method according to claim 10, wherein the anisotropic etching is dry etching, and the etching agent comprises $NF_3$ and $Cl_2$.

12. A buried wordline structure, comprising:
   a semiconductor substrate;
   a trench isolation structure, formed in the semiconductor substrate, wherein a surface layer of the semiconductor substrate is divided into a plurality of independent regions by the trench isolation structure;
   a first trench, provided in the semiconductor substrate, wherein the first trench with an epitaxial layer formed on an inner wall thereof has a planar bottom;
   a second trench, provided in the trench isolation structure, wherein the second trench has a tip on its bottom, the first trench and the second trench are connected with each other to form a connection trench, and the depth of the second trench is greater than that of the first trench;
   a gate dielectric layer, formed on an inner wall of the first trench; and
   a gate conductive layer, filled within the first trench and the second trench.

13. The buried wordline structure according to claim 12, wherein an upper surface of the gate dielectric layer is Ω-shaped.

14. The buried wordline structure according to claim 12, wherein the width of an opening of the first trench ranges from 30 nm to 50 nm.

15. The buried wordline structure according to claim 12, wherein the first trench has a filled epitaxial layer on its bottom to form a planar structure.

* * * * *